(12) United States Patent
Kuo et al.

(10) Patent No.: US 11,251,064 B2
(45) Date of Patent: Feb. 15, 2022

(54) WAFER FRAME SORTER AND STOCKER

(71) Applicant: Taiwan Semiconductor Manufacturing Co., Ltd., Hsinchu (TW)

(72) Inventors: Tsung-Sheng Kuo, New Taipei (TW); I-Lun Yang, Taoyuan (TW); Chih-Hung Huang, Hsinchu (TW); Jiun-Rong Pai, Hsinchu (TW); Chung-Hsin Chien, Zhubei (TW); Yang-Ann Chu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/807,026

(22) Filed: Mar. 2, 2020

(65) Prior Publication Data

US 2021/0272837 A1    Sep. 2, 2021

(51) Int. Cl.
  *H01L 21/687*  (2006.01)
  *H01L 21/67*   (2006.01)
  *H01L 21/677*  (2006.01)

(52) U.S. Cl.
  CPC .... *H01L 21/68707* (2013.01); *H01L 21/6773* (2013.01); *H01L 21/67271* (2013.01); *H01L 21/67294* (2013.01); *H01L 21/67733* (2013.01); *H01L 21/67742* (2013.01); *H01L 21/67769* (2013.01)

(58) Field of Classification Search
  CPC .. G06Q 10/087; G06Q 10/08; G06Q 10/0833; G06Q 10/06; G06Q 50/28; G05B 2219/45031; B65G 1/1371; B65G 1/1373; B65G 1/1378; H01L 21/68707; H01L 21/67271; H01L 21/67294; H01L 21/6773; H01L 21/67733; H01L 21/67742; H01L 21/67769; H01L 21/67775
  USPC ........ 700/115, 116, 121, 213, 214, 215, 225
  See application file for complete search history.

(56) References Cited

U.S. PATENT DOCUMENTS

| | | | |
|---|---|---|---|
| 5,343,403 A * | 8/1994 | Beidle | G11B 15/6835 360/69 |
| 6,146,077 A * | 11/2000 | Shin | H01L 21/67271 235/462.01 |
| 2007/0144439 A1* | 6/2007 | Englhardt | H01L 21/67742 118/719 |
| 2014/0186145 A1* | 7/2014 | Fehrmann | H01L 21/67745 414/222.01 |
| 2017/0338139 A1 | 11/2017 | Rebstock | |
| 2018/0190522 A1* | 7/2018 | Kim | H01L 21/67303 |
| 2019/0214281 A1* | 7/2019 | Endo | H01L 21/67748 |

(Continued)

FOREIGN PATENT DOCUMENTS

TW    533174 B    5/2003

*Primary Examiner* — Glenn F Myers
(74) *Attorney, Agent, or Firm* — Seed IP Law Group LLP (57) ABSTRACT

A wafer sorting and stoking system provides automated storage and retrieval of wafer frames carrying semiconductor wafers. A wafer frame cassette is received at a transfer port from a transfer system. A robot arm retrieves the wafer frames from the cassette and stores each wafer frame in a respective storage slot in one of a plurality of storage towers. The storage location of each wafer frame is recorded. Each wafer frame can be selectively retrieved and loaded into a wafer frame cassette by the robot arm for further processing.

19 Claims, 11 Drawing Sheets

(56) References Cited

U.S. PATENT DOCUMENTS

2020/0035532 A1* 1/2020 Takuma ............ H01L 21/67745
2020/0075430 A1* 3/2020 Sevillano ................ H01L 22/30
2020/0211882 A1* 7/2020 Kuwahara ............ B65G 1/0457
2020/0234990 A1* 7/2020 Tamura ............. H01L 21/67092

* cited by examiner

WAFER FRAME SORTER AND STOCKER

BACKGROUND

Technical Field

The present disclosure relates to the field of semiconductor processing. The present disclosure relates more particularly to sorting and stocking wafer frames carrying semiconductor wafers.

Description of the Related Art

Fabrication of integrated circuits is typically accomplished by performing a large number of processing steps on semiconductor wafers. The processing steps typically result in the formation of a large number of transistors in highly complex arrangements in conjunction with a semiconductor substrate. The processing steps also result in the formation of dielectric layers, metal interconnects, vias, plugs, and other integrated circuit structures and components.

When processing of the semiconductor wafer is substantially complete, the semiconductor wafer is loaded onto a wafer frame. After the semiconductor wafer is loaded onto the wafer frame, the semiconductor wafer is diced. After dicing, the semiconductor wafer may remain on the wafer frame during storage or transport. Sorting and storing wafer frames before and after dicing can be problematic due to the potential of misplacement and breakage

DETAILED DESCRIPTION

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
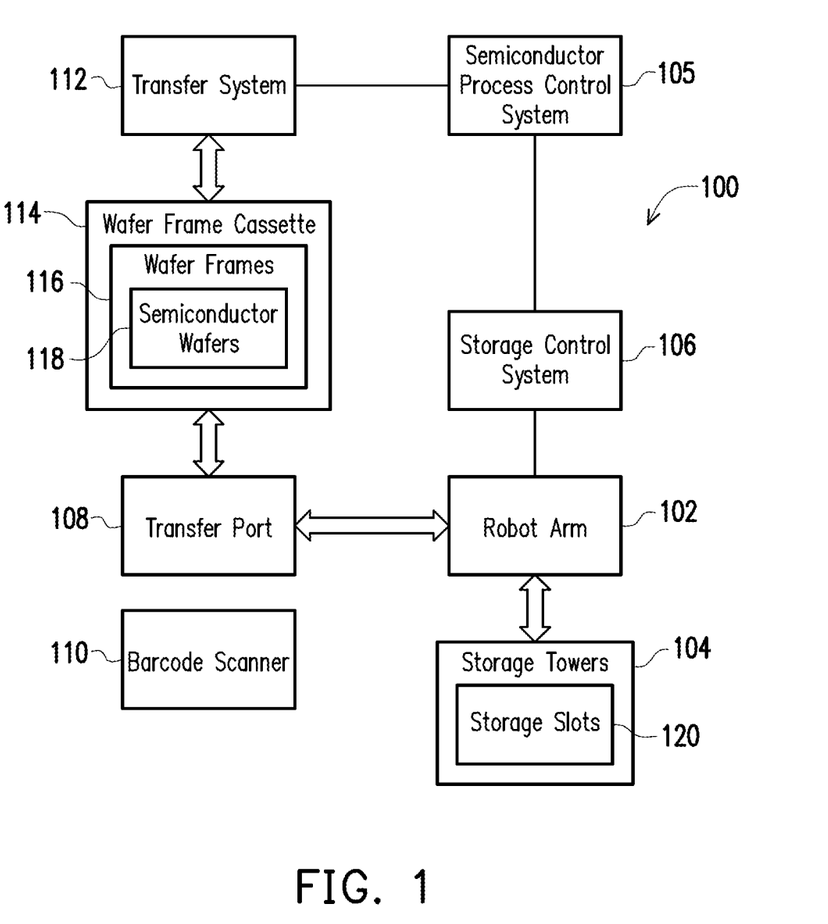
FIG. 1 is a block diagram of a wafer frame sorting and stocking system, according to one embodiment.

FIG. 1 is a block diagram of a wafer frame stoking and sorting system 100. The system includes a robot arm 102, storage towers 104, a control system 106, and a transfer port 108, according to various embodiments. The robot arm 102, the storage towers 104, the control system 106, and the transfer port 108 work together to remove wafer frames 116 from a wafer frame cassette 114 and to store the wafer frame cassettes. Each wafer frame 116 carries a semiconductor wafer 118.

The wafer frame sorting and stocking system 100 avoids the drawbacks of human sorting and stocking of wafer frames 116. In particular, the wafer frame sorting and stocking system 100 provides automated transport, sorting, tracking, and retrieval of wafer frames 116. This eliminates the need for humans to handle the wafer frames 116 or to manually track the location of individual wafer frames 116.

After the semiconductor wafers 118 are processed and are ready for dicing, each individual semiconductor wafer 118 is placed on a respective wafer frame 116. Each wafer frame 116 typically includes a metal ring (see FIG. 7). Each wafer frame 116 also includes an adhesive membrane such as a tape or another material stretched across the interior of the ring. The semiconductor wafer 118 is placed on the adhesive membrane. Accordingly, each wafer frame 116 carries a semiconductor wafer 118 on an adhesive membrane stretched in the interior defined by the metal ring. Wafer frames 116 can have shapes, membranes and configurations other than those described above without departing from the scope of the present disclosure.

Groups of wafer frames 116 are loaded into a wafer frame cassette 114 for transport. Each wafer frame cassette 114 includes a plurality of wafer frame slots. Each wafer frame slot holds an individual wafer frame 116. In one example, each wafer frame cassette 114 holds between 10 and 15 wafer frames 116. A wafer frame cassette 114 can hold fewer or more wafer frames without departing from the scope of the present disclosure.

After the semiconductor wafers 118 have been loaded onto wafer frames 116 and the wafer frames 116 have been loaded into the wafer frame cassette 114, the wafer frame cassette 114 is picked up by the transfer system 112. The transfer system 112 transports the wafer frame cassette 114 for sorting and stocking.

In one example, the transfer system 112 includes an overhead hoist transport system. The overhead hoist transport system typically includes a cassette carrier mounted on overhead rails. The overhead rails can be coupled to or suspended from the ceiling of various processing rooms. The overhead hoist transport system can also be used to transport semiconductor wafers 118 during or between various semiconductor processing steps. The transfer system 112 can include a transfer system other than an overhead hoist transport system without departing from the scope of the present disclosure.

The transfer system 112 carries the wafer frame cassette 114 to the transfer port 108. The transfer port receives the wafer frame cassette 114 from the transfer system 112. The transfer port 108 can securely hold the wafer frame cassette 114 so that individual wafer frames can be sorted and stocked, as will be described in more detail below.

The transfer system 112 can drop off the wafer frame cassette 114 at the transfer port 108. In this case, the wafer frame cassette 114 is completely detached from the transfer system 112 and held that the transfer port 108. Alternatively, the transfer system 112 can bring the wafer frame cassette 114 to the transfer port 108 and can hold the wafer frame cassette 114 at the transfer port 108 during unloading of the wafer frames 116 from the wafer frame cassette 114.

The wafer frame sorting and stocking system 100 includes a plurality of storage towers 104. Each storage tower includes a plurality of storage slots 120. Each storage slot 120 is configured to hold a wafer frame 116. Each storage tower 104 can include a large number of storage slots 120. In one example, each storage tower includes between 150 and 300 storage slots 120. The storage towers 104 can include other numbers of storage slots without departing from the scope of the present disclosure.

The wafer frame sorting and stocking system 100 includes a robot arm 102. The robot arm 102 is configured to automatically remove individual wafer frames 116 from the wafer frame cassette 114 at the transfer port 108. The robot arm 102 transfers each wafer frame 116 to a selected storage slot 120 within one of the storage towers 104.

The robot arm 102 can also remove wafer frames 116 from storage slots 120 in the storage towers 104. The robot arm 102 can transfer the wafer frames 116 from the storage slots 120 to a wafer frame cassette 114 at the transfer port 108. The robot arm 102 retrieves wafer frames from storage slots 120 and loads them into the wafer frame cassette 114 in a precise and careful manner. In practice, when the robot arm loads wafer frames 116 onto a wafer frame cassette 114, it may be the same wafer frame cassette 114 (first wafer frame cassette) from which the wafer frames 116 were unloaded or it may be a different wafer frame cassette 114 (second wafer frame cassette).

In one embodiment, the control system 106 includes a semiconductor process control system and a storage control system. The semiconductor process control system controls overall processing of semiconductor wafers. Accordingly, the semiconductor process control system can control the transport of semiconductor wafers 118, wafer frames 116, and wafer frame cassettes 114 within the semiconductor processing system 100. The semiconductor process control system controls the transfer system 112. The semiconductor process control system also controls the storage control system.

As described herein, the storage control system performs various functions related to the receiving, storing, sorting, and scanning of wafer frames. The storage control system can perform these functions under control of the semiconductor process control system. Accordingly, actions performed by the storage control system can be performed based on commands received from the semiconductor process control system. Actions performed by the semiconductor process control system and the storage control system are described herein as being performed by the control system 106.

The control system 106 controls the operation of the robot arm 102. The control system 106 controls the robot arm 102 to remove wafer frames 116 from a wafer frame cassette 114 at the transfer port 108. The control system 106 selects a storage slot 120 for each wafer frame 116. The robot arm 102 stores each wafer frame 116 in the respective storage slot 120 specified by the control system 106.

The control system 106 records the identity of each wafer frame 116 in a wafer frame cassette 114 that arrives at the transfer port 108. After the control system 106 has recorded the identity of each wafer frame 116, the control system 106 selects storage locations for each of the wafer frames 116. Each storage location is a respective storage slot 120 within one of the storage towers 104. The control system 106 can record storage address data indicating the storage location, i.e. the storage slot 120 and storage tower 104, of each wafer frame 116.

The control system 106 can include one or more processors and one or more computer memories. The computer memories can store data related to the wafer frames 116, including wafer frame identities and storage locations. The computer memories can also store data indicating the identity of semiconductor wafers 118 carried by the wafer frames 116. The computer memories can store software instructions that can be executed by the one or more processors. The software instructions can correspond to the various functions of the control system 106. Execution of the software instructions can enable the control system 106 to control the robot arm 102.

Components of the control system 106 can be located in disparate locations. For example, some processing and memory resources of the control system 106 can be located within the robot arm 102, while other processing and memory resources of the control system 106 can be located external to the robot arm 102.

The control system 106 can also include communication resources. The communication resources can include communication channels and communication devices. The communication resources can include wireless transmitters and receivers for communicating with the robot arm 102 and other systems and components. The communication resources can include wired communication links that enable communication with the robot arm 102 and with other systems and components. Many types of communication resources and schemes can be utilized without departing from the scope of the present disclosure.

The control system 106 can record data indicating a most recent processing step performed on the semiconductor wafers carried by the wafer frames 116. The control system 106 can record data indicating a next processing step or a next destination for the semiconductor wafers 118 and the wafer frames 116 that carry them.

In one example, semiconductor wafers 118 may be loaded onto wafer frames 116 in preparation for a dicing operation of the semiconductor wafers 118. The wafer frames 116 carrying the semiconductor wafers 118 may be delivered to the transfer port 108. The control system 106 can record the identities of the wafer frames 116 and their associated semiconductor wafers 118. The control system 106 can store data indicating that the semiconductor wafers 118 carried by the wafer frames 116 have not yet been diced. The control system 106 can select storage locations for the wafer frames 116 within the storage towers 104. The control system 106 can then control the robot arm 102 to transfer the wafer frames 116 from the wafer frame cassette 114 to the selected storage locations. The control system 106 can record the storage locations of the wafer frames 116.

In one example, a wafer frame cassette 114 may arrive at the transfer port 108 carrying wafer frames 116 holding semiconductor wafers 118 that have been diced. The control system 106 can record the identities of the wafer frames 116 and their associated semiconductor wafers 118. The control system 106 can store data indicating that the semiconductor wafers 118 carried by the wafer frames 116 have been diced. The control system 106 can select storage locations for the wafer frames 116 within the storage towers 104. The control system 106 can then control the robot arm 102 to transfer the wafer frames 116 from the wafer frame cassette 114 to the selected storage locations. The control system 106 can record the storage locations of the wafer frames 116.

In one example, the control system 106 can receive communication indicating that certain currently stored wafer frames 116 are scheduled to be transported to a dicing station so that their semiconductor wafers 118 can be diced. The control system 106 retrieves from memory the storage address data indicating the storage locations of each of the identified wafer frames 116. The control system 106 controls the robot arm 102 to retrieve the identified wafer frames 116 from the storage slots 120 indicated by the storage address data. The robot arm 102 loads the identified wafer frames 116 into a wafer frame cassette 114 at the transfer port 108.

In one example, the control system 106 can receive communication indicating that certain currently stored wafer frames 116 carrying previously diced semiconductor wafers 118 are scheduled to be transported for shipping or packaging. The control system 106 retrieves from memory the storage address data indicating storage locations of each of the identified wafer frames 116. The control system 106 controls the robot arm 102 to retrieve the identified wafer frames 116 from the storage slots 120 indicated by the storage address data. The robot arm 102 loads the identified wafer frames 116 into a wafer frame cassette 114 at the transfer port 108.

Though not shown in FIG. 1, the sorting and stocking system 100 can include a manual port. Wafer frame cassettes 114 are brought to the manual port manually by technicians, engineers, or scientists. The control system 106 controls the robot arm 102 to unload and store the wafer frames from the wafer frame cassette 114 as described previously. Likewise, the control system 106 can control the robot arm 102 to transfer wafer frames from the storage slots 120 to a wafer frame cassette 114 at the manual port.

The sorting and stocking system 100 can include multiple transfer ports 108. A first transfer port 108 may be dedicated for receiving wafer frames 116 for storage in the storage towers 104. A second transfer port 108 may be dedicated for exporting wafer frames from the storage towers 104 for transfer to another location or processing station. Various numbers and configurations of transfer ports 108 and manual transfer ports can be implemented in the wafer frame sorting and stocking system 100 without departing from the scope of the present disclosure.

The wafer frame sorting and stocking system 100 can include a barcode scanner 110. In this case, each wafer frame 116 includes a barcode identifying the wafer frame 116. The barcode can also identify the semiconductor wafer 118 carried on the wafer frame 116. The barcode scanner 110 is controlled by the control system 106. The barcode scanner 110 scans the barcodes of the wafer frames 116 when they arrive at the transfer port 108. In this way, the control system 106 ascertains the identity of each wafer frame 116 and semiconductor wafer 118 that arrives at the transfer port 108. Additionally, the barcode scanner 110 can scan the barcodes of all wafer frames 116 removed from the storage towers 104 for transfer.

The wafer frame sorting and stocking system 100 can include systems other than a barcode scanner 110 for ascertaining the identity of wafer frames 116 that arrive at the transfer port 108. For example, the wafer frame sorting and stocking system 100 can include imaging systems that capture images of the wafer frames decipher an identification mark included on the wafer frames. Alternatively, the wafer frame sorting and stocking system 100 can utilize RFID technology or another similar technology to ascertain the identity of wafer frames 116 that arrive at the transfer port 108. In this case, the wafer frames 116 may carry RFID tags or other similar technology for wirelessly transmitting identification codes related to the wafer frames 116. The frame sorting and stocking system 100 can include many types of identification systems for ascertaining the identities of wafer frames 116, wafer frame cassettes 114, and semiconductor wafers 118 without departing from the scope of the present disclosure.

In one embodiment, the control system 106 implements one or more algorithms for determining where wafer frames are stored among the storage slots 120 of the storage towers 104. The control system 106 directs the robot arm 102 to store the various wafer frames 116 among the storage slots 120 of the storage towers 104 in accordance with the one or more algorithms.

In one embodiment, when a wafer frame cassette 114 is received at the transfer port 108, the control system 106 reads from memory the currently unoccupied storage slots 120. Unoccupied storage slots 120 are available for receiving wafer frames 116. The control system 106 then selects empty and available storage slots 120 for the wafer frames 116 of the newly received wafer frame cassette 114.

In one embodiment, the control system 106 may select storage slots 120 within the one or more of the storage towers 104 based on a processing stage of the semiconductor wafers 118 held by the wafer frames 116. For example, a storage tower, or a group of storage slots 120 may be dedicated for storing wafer frames 116 whose semiconductor wafers 118 have not yet been diced. Another storage tower 104, or group of storage slots 120, may be dedicated for storing wafer frames 116 whose semiconductor wafers 118 have already been diced. Accordingly, after the barcode scanner 110 scans the wafer frames 116 and determines a current processing stage of the wafer frames 116 based on the barcode data, the control system 106 may select the designated storage tower 104 or group of storage slots 120 for storing the wafer frames 116. The control system 106 can then control the robot arm 102 to store the wafer frames 116 accordingly.

In one embodiment, the control system 106 gives priority to storage slots 120 that are not adjacent to storage slots 120 that currently hold a wafer frame 116. Accordingly, when available, the control system 106 controls the robot arm 102 to store the wafer frames 116 from the wafer frame cassette 114 in storage slots 120 that are not adjacent to an occupied storage slot 120. When the storage slots 120 of the storage towers 104 are filled with a large number of storage slots 120. If such storage slots 120 are not available, then the control system 106 controls the robot arm 102 to store the wafer frames 116 in storage slots 120 that are adjacent to occupied storage slots 120.

In one embodiment, the control system 106 receives humidity data from the humidity sensors associated with the various storage towers 104. The control system 106 may select storage slots 120 for the wafer frames 116 based on the humidity at those storage slots 120. If a humidity controller is not properly operating for one of the storage towers 104, then the control system 106 will not select the storage slots 120 of that storage tower for receiving wafer frames 116. Instead, the control system 106 will select storage slots 120 for which the humidity is in a selected humidity range.

In one embodiment, the control system 106 gives preference to available storage slots 120 that are closer to the transfer port 108. This is because the robot arm is less likely to make an error in transferring wafer frames 116, if the robot arm 102 transfers the wafer frames 116 over a smaller distance. Accordingly, the control system 106 selects available storage slots that are closest to the transfer port 108.

In one embodiment, the control system 106 gives preference to available storage slots 120 that are closest to a height of the transfer port 108. This is done because the robot arm 102 is less likely to make an error if the robot arm 102 does not need to raise or lower wafer frames 116 a large distance relative to the transfer port 108. This can reduce errors made by the robot arm 102 in transferring wafer frames 116. When the robot arm 102 retrieves a wafer frame 116 from the wafer frame cassette 114 at the transfer port 108, the control system 106 preferably selects a storage slot 120 that is near a same height as the transfer port 108. Accordingly, the control system 106 selects storage slots 120 that are closest in height within the storage towers 104 to the transfer port 108.

Figure 2:
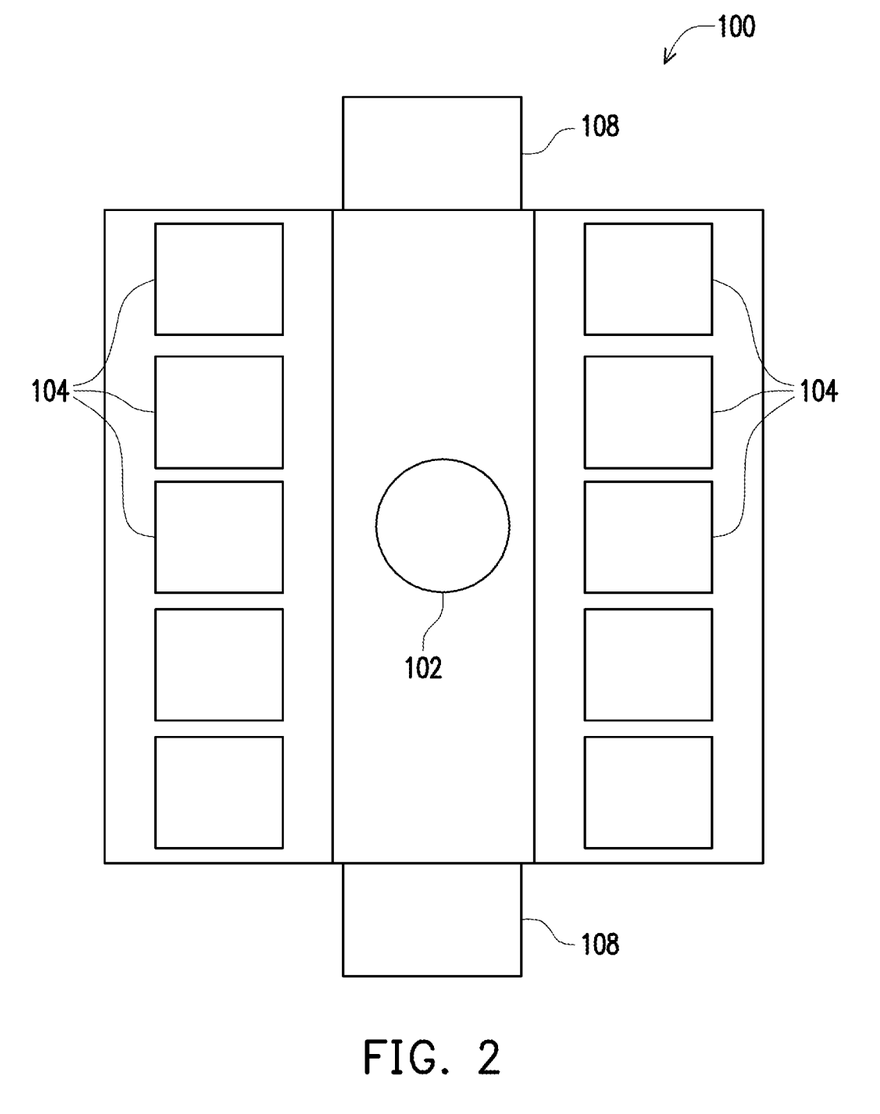
FIG. 2 is a top view of a wafer frame sorting and stocking system, according to one embodiment.

FIG. 2 is a top view of a wafer frame sorting and stocking system 100, according to an embodiment. The wafer frame sorting and stocking system 100 of FIG. 2 illustrates a plurality of storage towers 104, two loading ports 108, and the robot arm 102. The robot arm 102, under control of the control system 106, can automatically transfer wafer frames 116 from a transfer port 108 to transfer slots 120 within the storage towers 104. The robot arm 102 can also transfer wafer frames from the storage towers 104 to one of the transfer ports 108, as described in relation to FIG. 1.

The wafer frame sorting and stocking system 100 of FIG. 2 includes ten storage towers 104. The storage towers 104 are arranged in two rows of five storage towers. The robot arm 102 is positioned between the two rows of storage towers 104. The robot arm 102 is able to access every storage slot 120 within all of the storage towers 104.

The wafer frame sorting and stocking system 100 of FIG. 2 includes two transfer ports 108. A first transfer port 108 can be utilized for receiving or importing wafer frames 116 for storage within the storage towers 104. A second transfer port 108 can be utilized for exporting wafer frames 116 from the storage towers 104. Other configurations of transfer ports 108 can be utilized without departing from the scope of the present disclosure.

Figure 3:
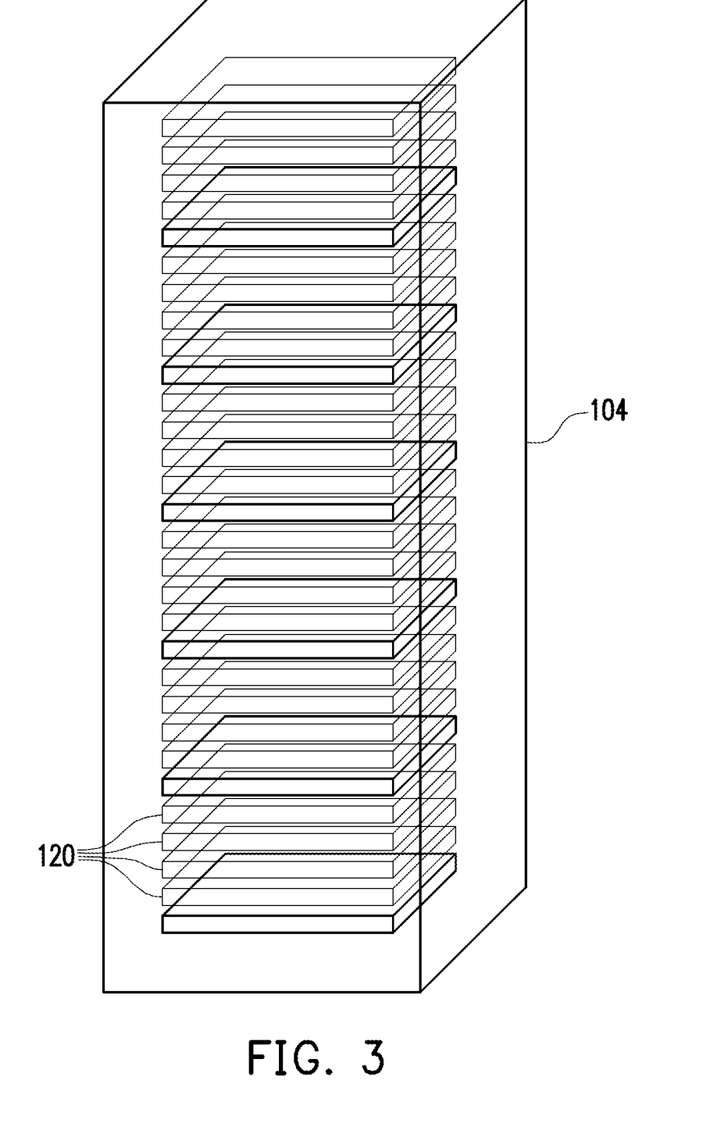
FIG. 3 is an illustration of a storage tower of a wafer frame sorting and stocking system, according to one embodiment.

FIG. 3 is an illustration of a storage tower 104, in accordance with one embodiment. The storage tower 104 includes a plurality of storage slots 120. Each storage slot 120 is configured to receive and store a wafer frame 116. Accordingly, each storage slot 120 has dimensions sufficient to store a wafer frame 116. In an example in which a wafer frame 116 has a diameter between 350 mm and 400 mm, each storage slot 120 can have first and second lateral dimensions between 420 mm and 450 mm. Each storage slot 120 can have a vertical dimension or height between 10 and 20 mm. Each storage slot 120 can include a receiving member for holding a wafer frame 116. The storage slots 120 can include dimensions and configurations other than those described above without departing from the scope of the present disclosure.

The storage tower 104 can have a height between 5000 mm and 8000 mm. The storage tower 104 can include 200 and 400 storage slots 120. The storage tower 104 can have other dimensions and other numbers of storage slots 120 without departing from the scope of the present disclosure.

The storage tower 104 can include a humidity control system (not shown). The humidity control system can include a humidity sensor and a gas outlet. The humidity sensors can sense a humidity level of the air. The humidity control system can output a dry gas, such as $N_2$ gas to adjust or control the humidity responsive to the humidity sensor. In one example, the interior of the storage tower 104 is maintained at 30% humidity. Alternatively, there may be a single humidity control system for all storage towers 104. In this case, each individual storage tower would not have a humidity control system, but rather a single humidity control system can control the humidity of all storage towers 104. The various types of humidity systems other than those described above can be implemented to control the humidity within the storage towers 104 without departing from the scope of the present disclosure.

The storage tower 104 can include one or more doors or shutters for selectively enabling access to the storage slots 120. In one example, a single door can be controllably opened and closed by the control system 102 to enable the robot arm 102 to gain access to the storage slots 120. In one example, the storage tower 104 can include multiple doors that can be controllably opened and closed to each provide access to a group of storage slots 120. In one example, the storage tower 104 includes a respective door for each slot 120 to selectively enable access to individual storage slots 120. Other types of access configurations for the storage slots 120 can be utilized without departing from the scope of the present disclosure.

Figure 4:
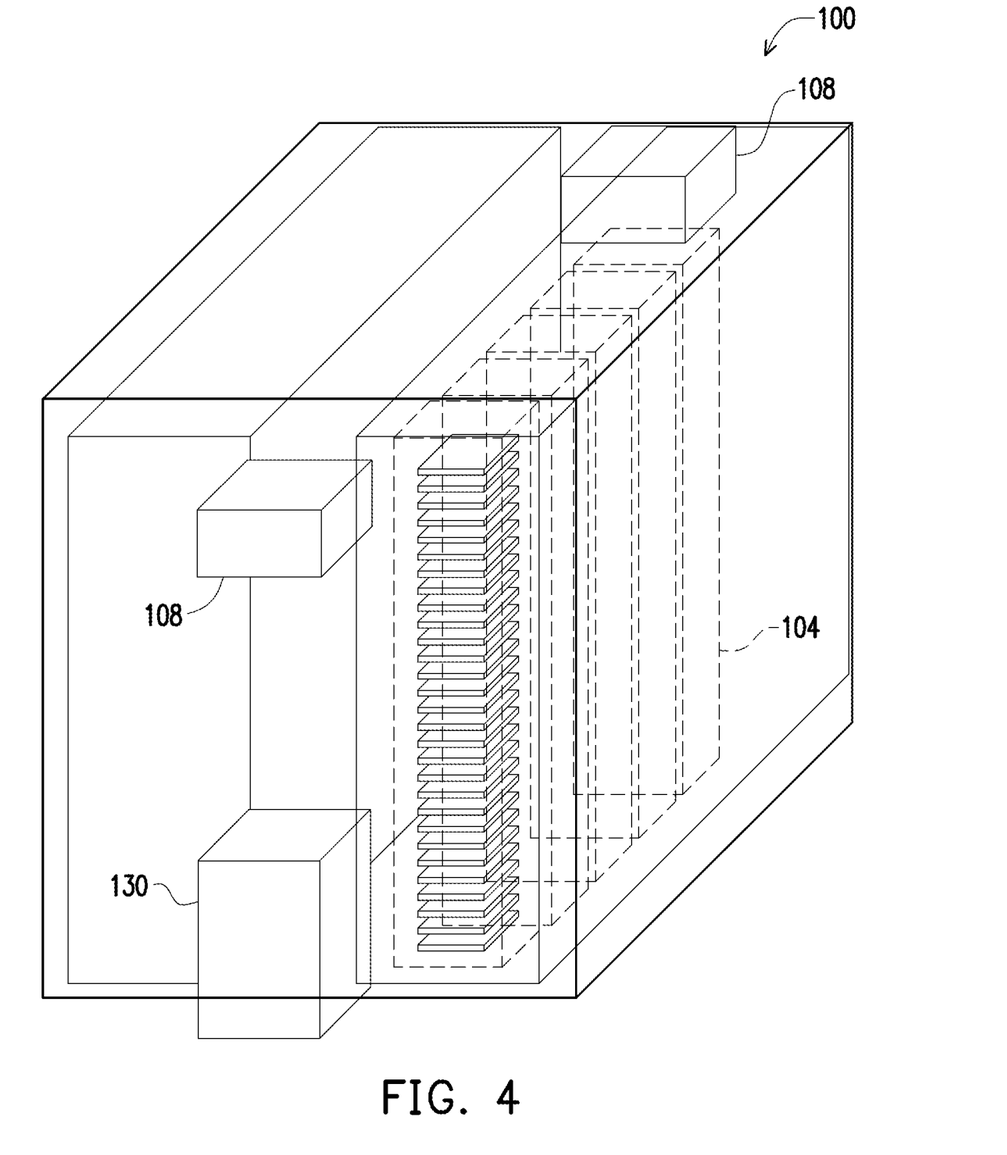
FIG. 4 is a perspective view of a wafer frame sorting and stocking system, according to one embodiment.

FIG. 4 is a perspective view of the wafer frame sorting and stocking system 100 of FIG. 2, according to an embodiment. The wafer frame sorting and stocking system 100 includes a manual transfer port 130 not visible in the view of FIG. 2. The robot arm 102 is not visible in the view of FIG. 4.

Wafer frame cassettes 114 are brought to the manual transfer port 130 manually by technicians or other personnel. The control system 106 controls the robot arm 102 to unload and store the wafer frames 116 from the wafer frame cassette 114 as described previously. Likewise, the control system 106 can control the robot arm 102 to transfer wafer frames from the storage slots 120 to a wafer frame cassette 114 at the manual transfer port 130.

Figure 5:
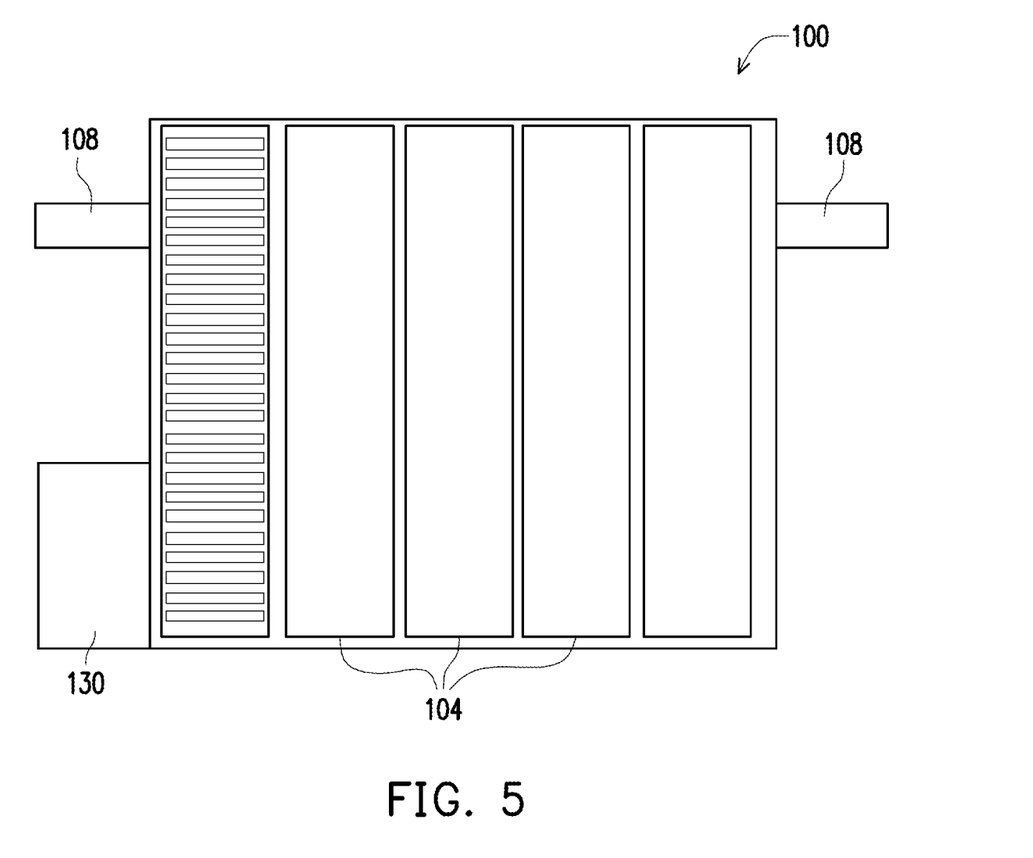
FIG. 5 is a side view of a wafer frame sorting and stocking system, according to one embodiment.

FIG. 5 is a side view of the wafer frame sorting and stocking system 100 of FIG. 2, according to an embodiment. One row of storage towers 104, the transfer ports 108, and the manual transfer port 130 are visible in FIG. 5. The robot arm 102 is not visible in the view of FIG. 5.

Figure 6:
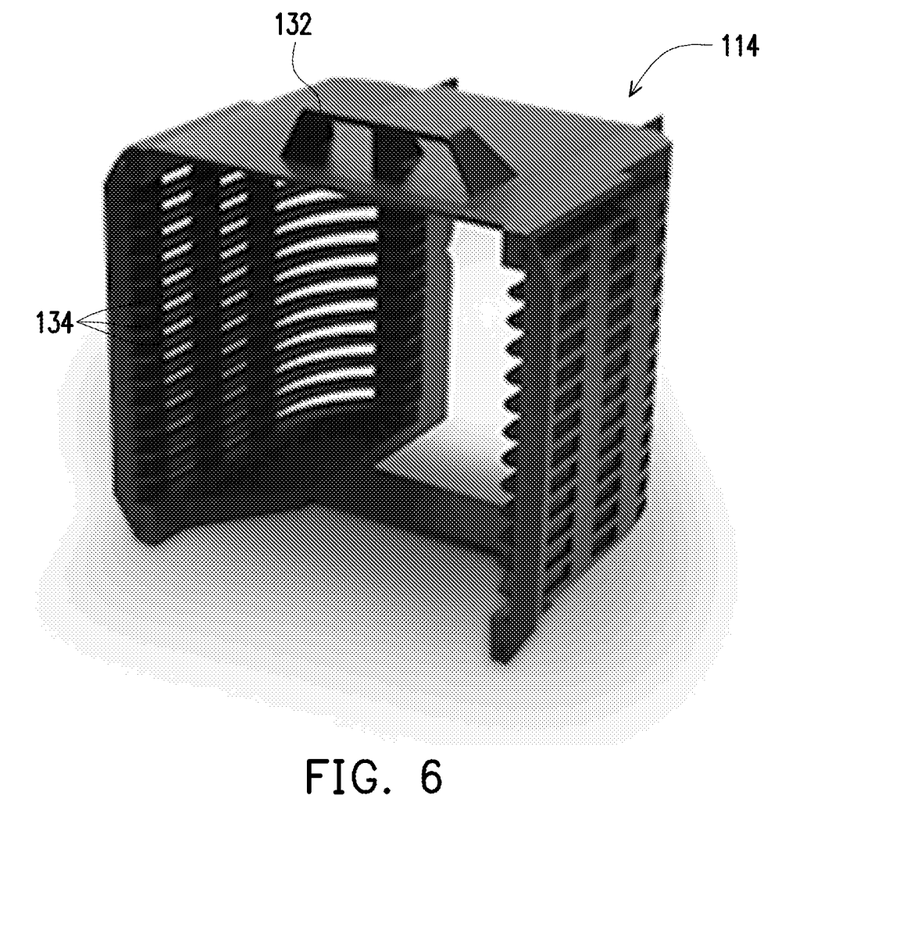
FIG. 6 is an illustration of a wafer frame cassette, according to one embodiment.

FIG. 6 is an illustration of a wafer frame cassette 114, according to an embodiment. The wafer frame cassette includes a handle 132. The handle 132 enables an automated transfer system to carry and transport the wafer frame cassette 114 to and from the transfer port 108. The handle 132 can also enable a human to carry the wafer frame cassette 114 to and from the manual transfer port 130.

The wafer frame cassette 114 includes a plurality of wafer frame slots 134. Each wafer frame slot 134 is configured to carry a wafer frame 116. In one example, the wafer frame cassette 114 includes between 10 and 15 wafer frame slots 134. The wafer frame cassette 114 can include other numbers of wafer frame slots 134 without departing from the scope of the present disclosure.

Figure 7:
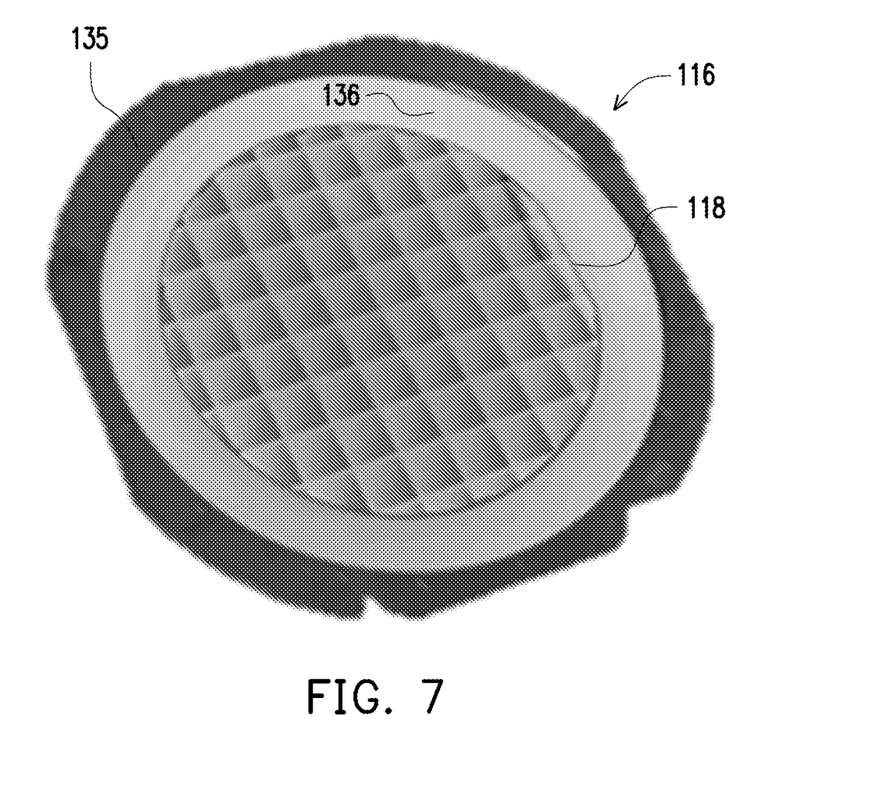
FIG. 7 is an illustration of a wafer frame, according to one embodiment.

FIG. 7 is an illustration of a wafer frame 116, according to an embodiment. The wafer frame 116 is carrying a semiconductor wafer 118. The wafer frame 116 includes a ring 135. The ring 135 has an interior diameter that is larger than the diameter of the semiconductor wafer 118. For example, if the semiconductor wafer 118 is a 300 mm wafer, then the wafer frame 116 may have an interior diameter between 350 mm and 400 mm.

The wafer frame 116 includes an adhesive membrane 136 stretched across the interior of the ring 135. The adhesive membrane 136 can include a tape or another material stretched across the interior of the ring. The semiconductor wafer 118 is placed on the adhesive membrane. The wafer frame 116 can carry a semiconductor wafer 118 other than a 300 mm wafer without departing from the scope of the present disclosure. Additionally, the wafer frame 116 can have dimensions, membranes and configurations other than those described above without departing from the scope of the present disclosure.

Figure 8:
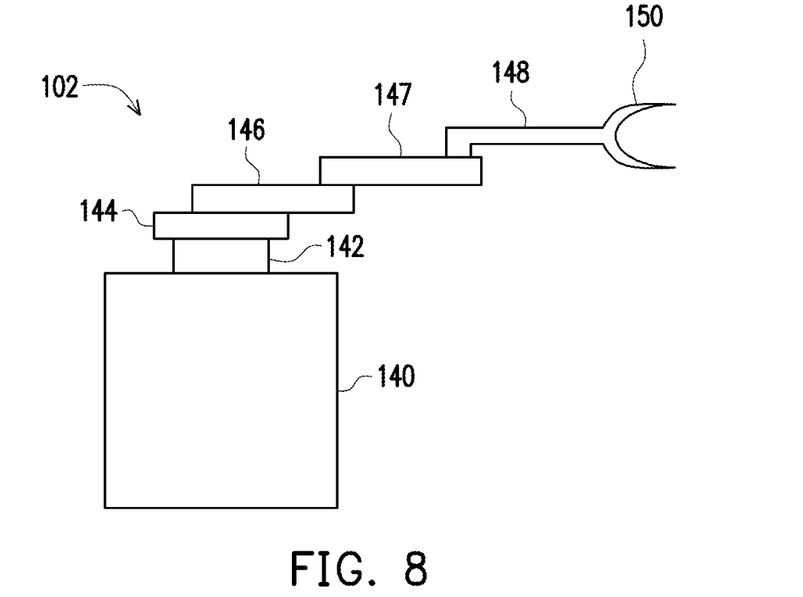
FIG. 8 is an illustration of a robot arm, according to one embodiment.

FIG. 8 is an illustration of a robot arm 102, according to an embodiment. The robot arm 102 can be utilized in the wafer frame sorting and stocking system 100 described herein. In particular, the robot arm 102 can be utilized to transfer wafer frames 116 between storage slots 120 and transfer ports 108 under the control of the control system 106.

The robot arm 102 includes a base 140. The base 140 is positioned on the ground or on a selected platform. The robot arm 102 includes telescoping members 142. The telescoping members 142 telescope vertically to enable retrieval or storage of wafer frames 116 at the varying heights of the storage slots 120 in the various storage towers 104.

A mount 144 is coupled to the telescoping members 142. An arm member 146 is mounted to the mount 144. The arm member 146 can rotate relative to the mount 144. An arm member 147 is coupled to the arm member 146. The arm member 147 can rotate relative to the arm 146. In arm member 148 is coupled to the arm member 147. The arm number 148 can rotate relative to the arm member 147. Carrying prongs 150 are attached to the end of the arm member 148. The carrying prongs 150 pickup and carry the wafer frames 116. The various arm members and their rotatability enables the robot arm 102 to reach all storage slots 120 within the various storage towers 104. A robot arm 102 can include configurations other than that shown in FIG. 8 without departing from the scope of the present disclosure.

The robot arm 102 can include internal electronic circuitry. The internal electronic circuitry causes the movements of the various components of the robot arm 102. The internal electronic circuitry can include processors, computer memories, and communication resources. A portion of the control system 106 can be included in the electronic circuitry of the robot arm 102.

Figure 9:
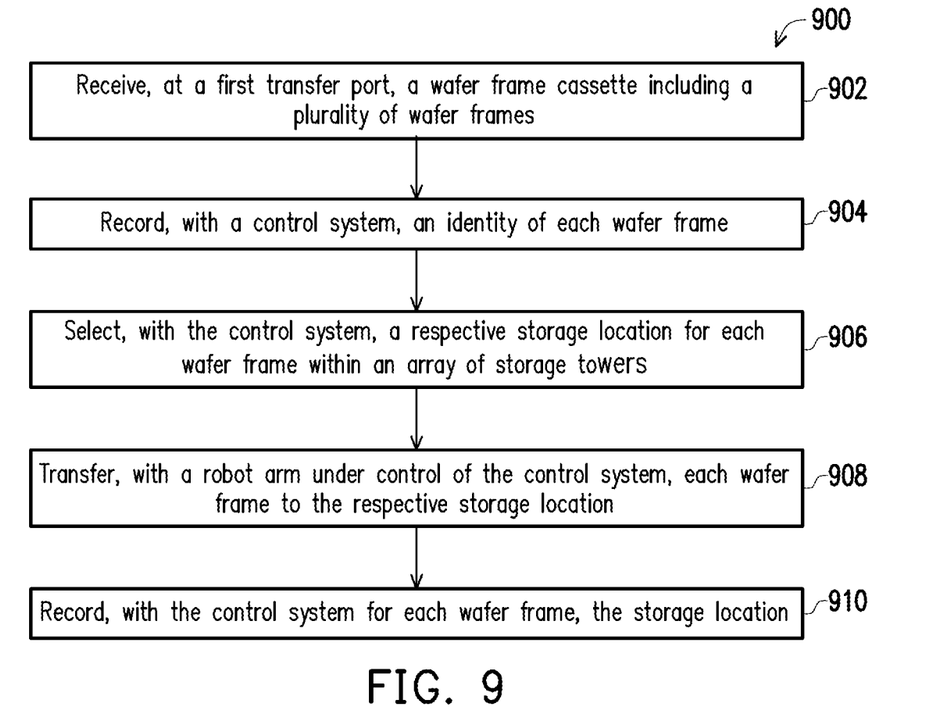
FIG. 9 is a method for sorting and stocking wafer frames, according to one embodiment.

FIG. 9 is a flow diagram of a method 900, according to an embodiment. At 902, the method 900 includes receiving, at a first transfer port, a wafer frame cassette including a plurality of wafer frames. One example of a first transfer port is the transfer port 108 of FIG. 1. One example of a control system is the control system 106 of FIG. 1. One example of a wafer frame cassette is the wafer frame cassette 114 of FIG. 1. At 904 the method 900 includes recording, with a control system, an identity of each wafer frame. One example of a control system is the control system 106 of FIG. 1. At 906, the method 900 includes selecting, with the control system, a respective storage location for each wafer frame within an array of storage towers. One example of storage towers is the storage towers 104 of FIG. 1. At 908, the method 900 includes transferring, with a robot arm under control of the control system, each wafer frame to the respective storage location. One example of a robot arm is the robot arm 102 of FIG. 1. At 910, the method 900 includes recording, with the control system for each wafer frame, the storage location.

Figure 10:
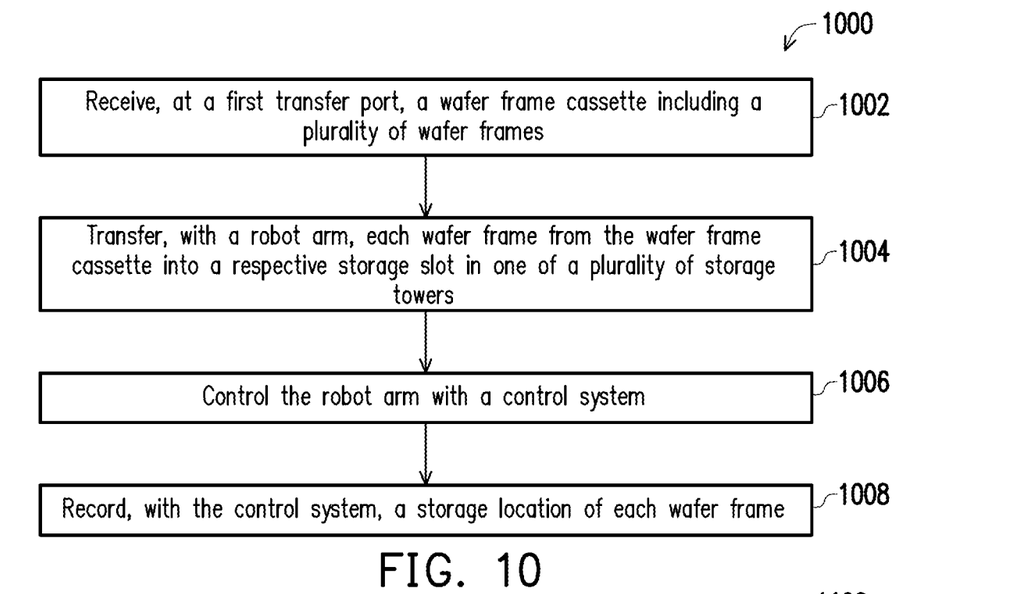
FIG. 10 is a method for sorting and stocking wafer frames, according to one embodiment.

FIG. 10 is a flow diagram of a method 1000, according to an embodiment. At 1002, the method 1000 includes receiving, at a first transfer port, a wafer frame cassette including a plurality of wafer frames. One example of a first transfer port is the transfer port 108 of FIG. 1. One example of a wafer frame cassette is the wafer frame cassette 114 of FIG. 1. One example of a wafer frame is the wafer frame 116 of FIG. 1. At 1004, the method 1000 includes transferring, with a robot arm, each wafer frame from the wafer frame cassette into a respective storage slot in one of a plurality of storage towers. One example of a robot arm is the robot arm 102 of FIG. 1. One example of storage towers is the storage towers 104 of FIG. 1. One example of a storage slot is the storage slots 120 of FIG. 1. At 1006, the method 1000 includes controlling the robot arm with a control system. One example of a control system is the control system 106 of FIG. 1. At 1008, the method 1000 includes recording, with the control system, a storage location of each wafer frame.

Figure 11:
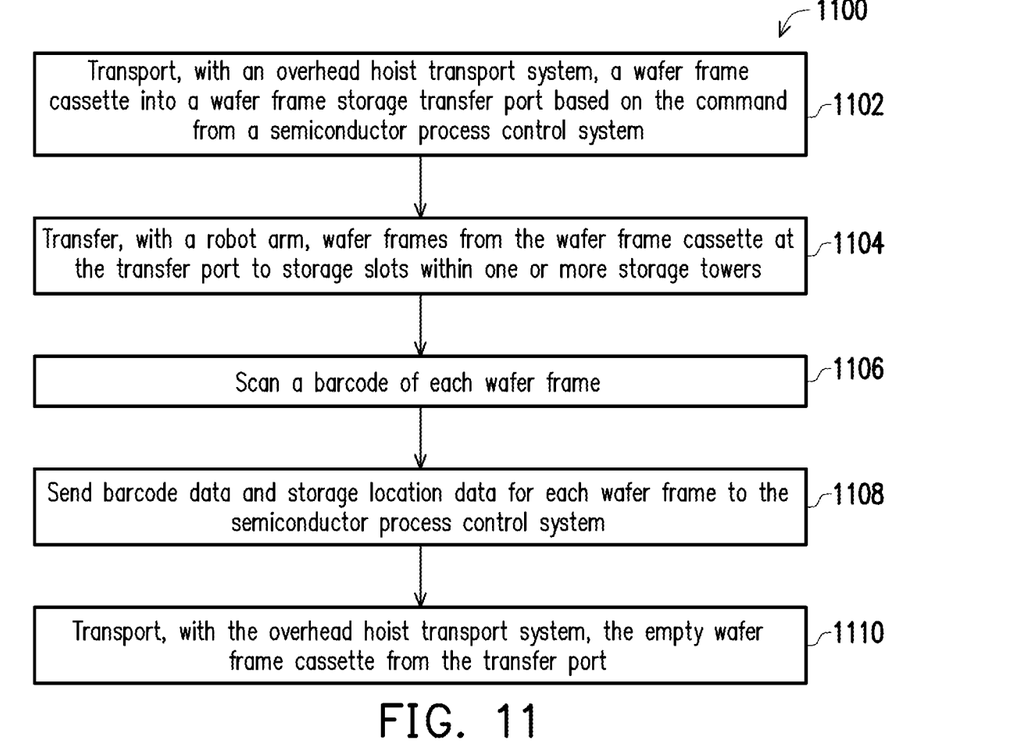
FIG. 11 is a method for sorting and stocking wafer frames, according to one embodiment.

FIG. 11 is a flow diagram of a method 1100, according to one embodiment. At 1102, the method 1100 includes transporting, with an overhead hoist transport system, a wafer frame cassette into a wafer frame storage transfer port based on the command from a semiconductor process control system. One example of an overhead hoist transport system is the transfer system 112 of FIG. 1. One example of a wafer frame cassette is the wafer frame cassette 114 of FIG. 1. One example of a wafer frame storage transfer port is the transfer port 108 of FIG. 1. One example of a semiconductor process control system is the control system 106 of FIG. 1. At 1104, the method 1100 includes transferring, with a robot arm, wafer frames from the wafer frame cassette at the transfer port to storage slots of one or more storage towers. One example of a robot arm is the robot arm 102 of FIG. 1. One example of wafer frames is the wafer frames 116 of FIG. 1. One example of a storage tower is the storage towers 104 of FIG. 1. One example of storage slots is the storage slots 120 of FIG. 1. At 1106, the method 1100 includes scanning a bar code of each wafer frame. At 1108, the method 1100 includes sending barcode data and storage location data for each wafer frame to the semiconductor process control system. At 1110, the method 1100 includes transporting, with the overhead hoist transport system, the empty wafer frame cassettes from the transfer port.

Figure 12:
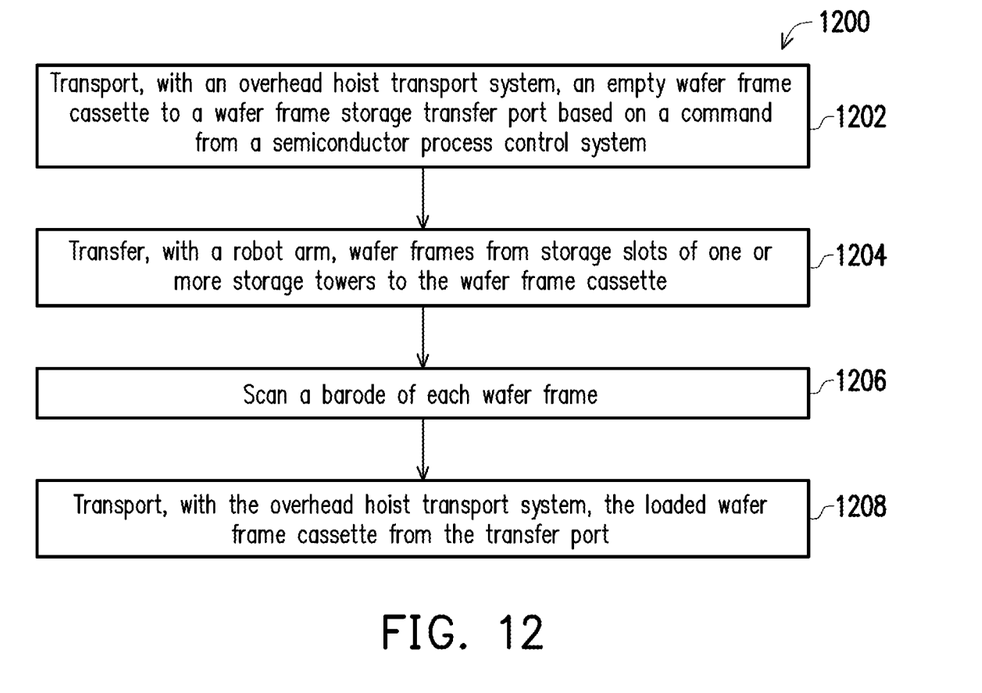
FIG. 12 is a method for sorting and stocking wafer frames, according to one embodiment.

FIG. 12 is a flow diagram of a method 1200, according to one embodiment. At 1202, the method 1200 includes transporting, with an overhead hoist transport system, an empty wafer frame cassette to a wafer frame storage transfer port based on the command from the semiconductor process control system. One example of an overhead hoist transport system is the transfer system 112 of FIG. 1. One example of a wafer frame cassette is the wafer frame cassette 114 of FIG. 1. One example of a wafer frame storage transfer port is the transfer port 108 of FIG. 1. One example of a semiconductor process control system is the control system 106 of FIG. 1. At 1204, the method 1200 includes transferring, with the robot arm, wafer frames from storage slots of one or more storage towers to the wafer frame cassette. One example of a robot arm is the robot arm 102 of FIG. 1. One example of wafer frames is the wafer frames 116 of FIG. 1. One example of a storage tower is the storage towers 104 of FIG. 1. One example of storage slots is the storage slots 120 of FIG. 1. At 1206, the method 1200 includes scanning a bar code of each wafer frame. At 1208, the method 1200 includes transporting, with the overhead hoist transport system, the loaded wafer frame cassette from the transfer port.

Figure 13:
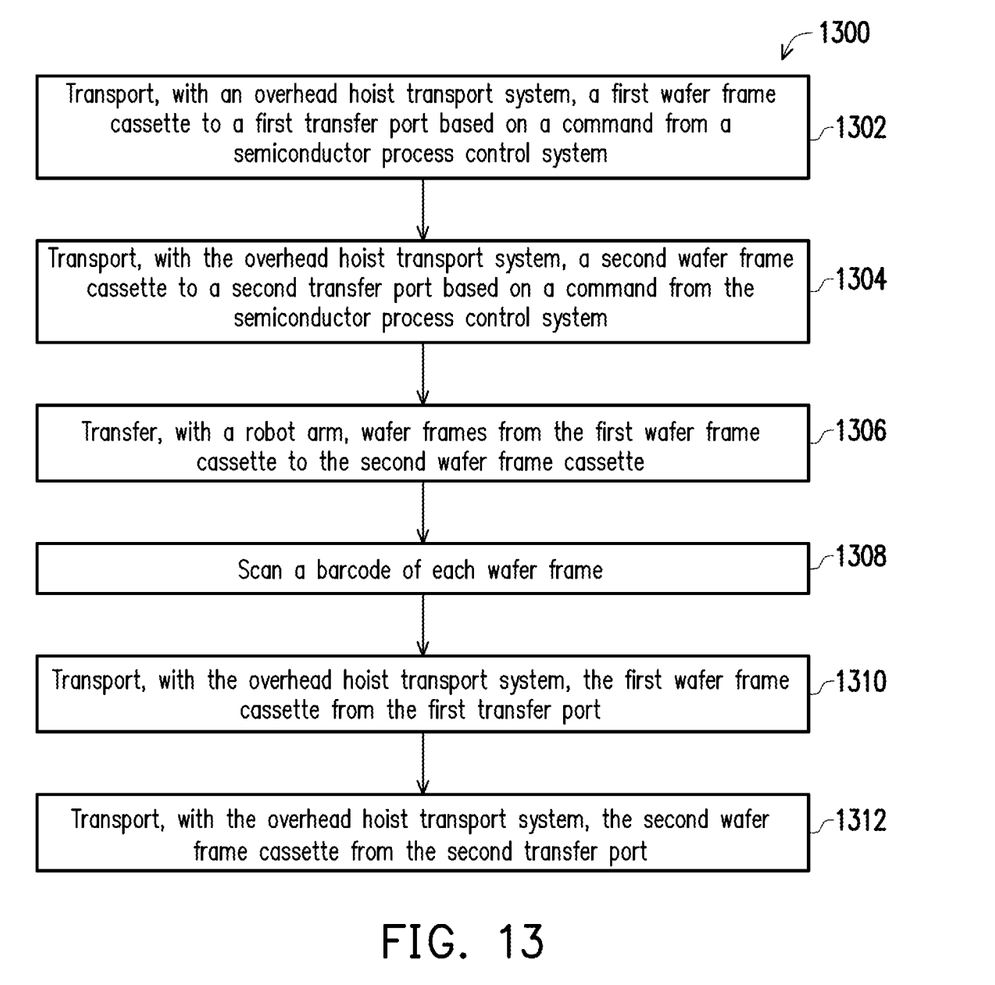
FIG. 13 is a method for sorting and stocking wafer frames, according to one embodiment.

FIG. 13 is a flow diagram of a method 1300, according to one embodiment. At 1302, the method 1300 includes transporting, with an overhead hoist transport system, the first wafer frame cassette to a first transfer port based on a command from the semiconductor process control system. One example of an overhead hoist transport system is the transfer system 112 of FIG. 1. One example of a wafer frame cassette is the wafer frame cassette 114 of FIG. 1. One example of a wafer frame storage transfer port is the transfer port 108 of FIG. 1. One example of a semiconductor process control system is the control system 106 of FIG. 1. At 1304, the method 1300 includes transporting, with the overhead hoist transport system, a second wafer frame cassette to a second transfer port based on the command from the semiconductor process control system. At 1306, the method 1300 includes transferring, with a robot arm, wafer frames from the first wafer frame cassette to the second wafer frame cassette. At 1308, the method 1300 includes scanning a bar code of each wafer frame. At 1310, the method 1300 includes transporting, with the overhead hoist transport system, the first wafer frame cassette from the first transfer point. At 1312, the method 1300 includes transporting, with the overhead hoist transport system, the second wafer frame cassette the second transfer port.

In one embodiment, a system includes a first transfer port configured to receive a first wafer frame cassette from a transfer system. The system includes a plurality of storage towers each including a plurality of storage slots. The system includes a robot arm configured to retrieve wafer frames from the first wafer frame cassette at the transfer port and to store each wafer frame in a respective storage slot. The system includes a control system configured to record an identity of each wafer frame received at the first transfer port, to control the robot arm, and to record, for each wafer frame, storage address data identifying the storage slot of the wafer frame.

In one embodiment, a method includes receiving, at a first transfer port a wafer frame cassette including a plurality of wafer frames. The method includes transferring, with a robot arm, each wafer frame from the wafer frame cassette into a respective storage slot in one of a plurality of storage towers. The method includes controlling the robot arm with a control system. The method includes recording, with the control system, a storage location of each wafer frame.

In one embodiment, a method includes receiving, at a first transfer port, a wafer frame cassette including a plurality of wafer frames. The method includes recording, with a control system, an identity of each wafer frame. The method includes selecting, with the control system, a respective storage location for each wafer frame within an array of storage towers. The method includes transferring, with a robot arm under control of the control system, each wafer frame to the respective storage location. The method includes recording, with the control system for each wafer frame, the storage location.

The various embodiments described above can be combined to provide further embodiments. All U.S. patent application publications and U.S. patent applications referred to in this specification and/or listed in the Application Data Sheet are incorporated herein by reference, in their entirety. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system comprising:
  a first transfer port configured to receive a first wafer frame cassette from a transfer system;

a second transfer port;

a plurality of storage towers each including a plurality of storage slots;

a robot arm configured to retrieve wafer frames from the first wafer frame cassette at the transfer port, to store each wafer frame in a respective storage slot, and to retrieve selected wafer frames from their respective storage slots and to load the selected wafer frames into a second wafer frame cassette at the second transfer port; and a control system configured to record an identity of each wafer frame received at the first transfer port, to control the robot arm, and to record, for each wafer frame, storage address data identifying the storage slot of the wafer frame.

2. The system of claim 1, wherein the storage towers are arranged in two rows of storage towers, wherein the robot arm is positioned between the two rows of storage towers.

3. The system of claim 1, wherein each storage tower includes 200 or more storage slots.

4. The system of claim 1, wherein the first transfer port is an overhead hoist transfer port configured to receive wafer frame cassettes from an overhead hoist transfer system.

5. The system of claim 1, further comprising a bar code reader configured to read a bar code of each wafer frame at the transfer port.

6. The system of claim 1, further comprising a manual port, wherein the control system is configured to control the robot arm to retrieve wafer frames from the manual port for storage in the storage towers.

7. The system of claim 1, further comprising a humidity control system configured to control a humidity within one or more of the storage towers.

8. The system of claim 7, wherein the humidity control system includes a humidity sensor and a gas output configured to control the humidity by outputting a gas.

9. A method, comprising:

receiving, at a first transfer port, a first wafer frame cassette including a plurality of wafer frames;

transferring, with a robot arm, each wafer frame from the first wafer frame cassette into a respective storage slot in one of a plurality of storage towers;

retrieving, with the robot arm, the wafer frames from their respective storage slots;

transferring with the robot arm, the wafer frames to a second wafer frame cassette at a controlling the robot arm with a control system; and recording, with the control system, a storage location of each wafer frame.

10. The method of claim 9, further comprising controlling a humidity within each storage tower.

11. The method of claim 10, wherein controlling the humidity includes sensing the humidity and outputting a gas responsive to the sensed humidity.

12. The method of claim 9, further comprising scanning a bar code of each wafer frame prior to transferring the wafer frame from the transfer port.

13. The method of claim 9, wherein the robot arm is positioned between two rows of storage towers.

14. A method, comprising:

receiving, at a first transfer port, a first wafer frame cassette including a plurality of wafer frames;

recording, with a control system, an identity of each wafer frame;

selecting, with the control system, a respective storage location for each wafer frame within an array of storage towers;

transferring, with a robot arm under control of the control system, each wafer frame to the respective storage location;

recording, with the control system for each wafer frame, the storage location;

selecting, with the control system, a wafer frame for retrieval from the array of storage towers;

identifying the storage location of the selected wafer frame;

retrieving, with the robot arm, the selected wafer frame from the storage location; and transferring the selected wafer frame to a second wafer frame cassette at a second transfer port.

15. The method of claim 14, further comprising:

transferring the selected wafer frame from the first or second transfer port to a dicing station; and dicing, at the dicing station, a semiconductor wafer carried by the selected wafer frame.

16. The method of claim 14, wherein each wafer frame carries a semiconductor wafer.

17. The method of claim 14, wherein the storage towers are arranged in two rows of storage towers, wherein the robot arm is positioned between the two rows of storage towers.

18. The method of claim 14, wherein each storage tower includes 200 or more storage slots.

19. The method of claim 14, wherein the first transfer port is an overhead hoist transfer port configured to receive wafer frame cassettes from an overhead hoist transfer system.

* * * * *